United States Patent
Tanaka

(10) Patent No.: US 8,510,071 B2
(45) Date of Patent: Aug. 13, 2013

(54) HIGH-FREQUENCY MEASURING DEVICE AND HIGH-FREQUENCY MEASURING DEVICE CALIBRATION METHOD

(75) Inventor: Ryohei Tanaka, Osaka (JP)

(73) Assignee: DAIHEN Corporation, Osaka (JP)

( * ) Notice: Subject to any disclaimer, the term of this patent is extended or adjusted under 35 U.S.C. 154(b) by 313 days.

(21) Appl. No.: 13/044,218

(22) Filed: Mar. 9, 2011

(65) Prior Publication Data
US 2011/0238356 A1    Sep. 29, 2011

(30) Foreign Application Priority Data
Mar. 23, 2010 (JP) ................... 2010-066472

(51) Int. Cl.
*G01R 35/00* (2006.01)
(52) U.S. Cl.
USPC ............................................. 702/107
(58) Field of Classification Search
USPC ............................................. 702/107
See application file for complete search history.

(56) References Cited

U.S. PATENT DOCUMENTS
2007/0152678 A1 *  7/2007  Matoba et al. ............... 324/601

FOREIGN PATENT DOCUMENTS
JP    2004-309132    11/2004
JP    2007-163308    6/2007

\* cited by examiner

*Primary Examiner* — Aditya Bhat
(74) *Attorney, Agent, or Firm* — Hamre, Schumann, Mueller & Larson, P.C.

(57) ABSTRACT

A method is provided for calibrating voltage values and current values detected by a high-frequency measuring device. In a first step, a first parameter is calculated based on impedances calculated when the measuring device is connected to a first set of three reference loads and impedances of the first set of three reference loads. In a second step, plasma processing is carried out with the measuring device connected to a load to be measured, and detected voltage and current values are calibrated using the first parameter, and impedances as viewed from a connection point towards the load side are calculated based on the calibrated voltage and current values. In a third step, three impedances that encompass, when displayed on a Smith chart, a narrower range than a range encompassed by the impedances of the first set of three reference loads are determined, where the narrower range includes the impedances calculated in the second step. In a fourth step, a second parameter is calculated based on impedances calculated when the measuring device is connected to a second set of three reference loads respectively having the three impedances and also on impedances of the second set of three reference loads. In a fifth step, the measuring device is connected to the load to be measured, and detected voltage and current values are calibrated using the first parameter and the second parameter.

10 Claims, 7 Drawing Sheets

HIGH-FREQUENCY MEASURING DEVICE AND HIGH-FREQUENCY MEASURING DEVICE CALIBRATION METHOD

BACKGROUND OF THE INVENTION

1. Field of the Invention

The present invention relates to a high-frequency measuring device that detects high-frequency voltage and high-frequency current and measures that voltage and current by calculating high-frequency parameters such as an impedance, and to a calibration method for such a high-frequency measuring device.

2. Description of the Related Art

In the past, plasma processing systems have been developed that process processed articles such as semiconductor wafers or liquid crystal substrates using a method such as etching by supplying high-frequency electrical power output from a high-frequency power supply device to a plasma processing device. (See Japanese Patent Application Laid-Open Nos. 2007-163308 and 2004-309132, for example.)

FIG. 10 is a block diagram showing the configuration of a typical plasma processing system.

Since an impedance of a plasma processing device 400 fluctuates during plasma processing, there is the risk of a reflected power reflected at an input end of the plasma processing device 400 damaging a high-frequency power supply device 100. Thus, an impedance matching device 200 is typically provided in a plasma processing system A100 between the high-frequency power supply device 100 and the plasma processing device 400, and the impedance matching device 200 carries out a matching operation corresponding to fluctuations in the impedance of the plasma processing device 400. In addition, it is necessary to monitor the impedance of the plasma processing device 400 and high-frequency voltage and high-frequency current and the like at the input end of the plasma processing device 400 during plasma processing.

Monitoring of the plasma processing device 400 is carried out using various high-frequency parameters measured by a high-frequency measuring device 300 provided at the input end of the plasma processing device 400. In addition, the matching operation of the impedance matching device 200 is carried out by control based on various high-frequency parameters measured by a high-frequency measuring device (not shown) provided within the impedance matching device 200. Furthermore, the following explanation is provided using the high-frequency measuring device 300 as an example.

Together with the high-frequency measuring device 300 detecting high-frequency voltage (to be simply referred to as "voltage") and high-frequency current (to be simply referred to as "current") and determining a phase difference θ of the voltage and current from the detected values (to be simply referred to as "phase difference"), it also calculates high-frequency parameters such as an effective voltage value V, an effective current value I, an impedance Z=R+jX (equivalent to the impedance of the plasma processing device 400 since the measurement point is in the vicinity of the input end of the plasma processing device 400), a reflection coefficient Γ, a forward power Pf input to the plasma processing device 400, and a reflected power Pr reflected at the input end of the plasma processing device 400 due to impedance mismatch.

The high-frequency measuring device 300 has a capacitor capacitatively coupled to a rod-shaped semiconductor for transmitting electrical power to the plasma processing device 400 and a coil magnetically coupled to the body portion thereof, and detects a voltage v=√2·V·sin(ωt) with the capacitor or a current i=√2·I·sin(ωt+θ) with the coil. In addition, the high-frequency measuring device 300 determines the effective voltage value V, the effective current value I and the phase difference θ from a detected voltage v and current i, and then calculates the high-frequency parameters described above using these values according to the following equations (1) to (5). Namely, the high-frequency measuring device 300 is referred to as a so-called RF sensor provided with sensors for detecting the voltage v and current i, and an arithmetic processing circuit for calculating the high-frequency parameters from the detected values of those sensors.

$$R = \frac{V}{I}\cos\theta \qquad (1)$$

$$X = \frac{V}{I}\sin\theta \qquad (2)$$

$$Z = R + jX \qquad (3)$$

$$\Gamma = \sqrt{\left(\frac{R^2 + X^2 - 1}{(R+1)^2 + X^2}\right)^2 + \left(\frac{2X}{(R+1)^2 + X^2}\right)^2}$$

$$Pf = \frac{VI\cos\theta}{1 - \Gamma^2} \qquad (4)$$

$$Pr = Pf\Gamma^2 \qquad (5)$$

In general, since values detected with sensors differ from the correct values due to variations in sensor sensitivity, monitoring devices and measuring devices are typically composed to acquire calibration data that converts detected values to correct values by preliminarily measuring a measured object serving as a reference, and then correcting detected values to correct detection values with the calibration data during actual measurement.

Short-Open-Load-Thru (SOLT) calibration is used to calibrate the voltage v and current i detected by the high-frequency measuring device 300. SOLT calibration consists of first connecting the high-frequency measuring device 300 to a standard having a preliminarily specified true value of an impedance, and then measuring the impedance with the high-frequency measuring device 300. A dummy load having a characteristic impedance of the measurement system (characteristic impedance of a transmission line that transmits high-frequency waves for measurement, and typically an impedance of 50 or 75Ω) and dummy loads having an impedance close to each of an open-circuit impedance (an infinitely large impedance) and a short-circuit impedance (a zero impedance) are used as standards. Next, calibration parameters for calibrating the voltage v and the current i are calculated from an impedance of each standard measured by the high-frequency measuring device 300 and a true value of the impedance of each standard, and then recorded in memory (not shown) of the high-frequency measuring device 300. During actual measurement, each high-frequency parameter is calculated after having corrected the detected voltage v and current i with the calibration parameters recorded in memory.

Since calibration parameters recorded in memory of the high-frequency measuring device 300 are calculated based on impedances approximating limiting values consisting of the open-circuit impedance (the infinitely large impedance) and the short-circuit impedance (the zero impedance) as well as on a characteristic impedance, values can be corrected over an extremely wide range of impedances.

However, since the calibration parameters are determined to that calibration can be carried out over an extremely wide range of impedances, the accuracy of calibration using these calibration parameters is not sufficiently high. Namely, the calibration parameters enable calibration to be carried out at low accuracy over an extremely wide range of impedances. However, in the case of actually using measured values of the high-frequency measuring device 300 to monitor the plasma processing device 400, the accuracy of calibration is required to be high.

For example, since the plasma processing device 400 generates considerable heat when carrying out plasma processing, the ambient temperature of the high-frequency measuring device 300 arranged in close proximity to the plasma processing device 400 also becomes high. If the ambient temperature when carrying out calibration and the ambient temperature during actual measurement differ since the resistance component changes when temperature varies, the accuracy of calibration becomes even lower. In consideration thereof, it is necessary to derive and acquire calibration parameters enabling highly accurate calibration by determining under the same temperature conditions for the measured load and the detection units.

In addition, there are many cases during plasma processing in which the phase difference θ between a detected voltage v and a current i is close to 90°. Thus, the rate of change of cos θ becomes large even if there is only a slight error in the phase difference θ, thereby having a considerable effect on measured values of a resistance component R and a and a forward voltage Pf of an impedance (refer to the previously described equations (1) and (4)). Thus, calibration is required to be carried out with high accuracy in order to suppress error of the phase difference θ.

In addition, measured values of the high-frequency measuring device 300 may also be used for an E chuck controller and the like. An E chuck controller controls the strength of an electrostatic chuck for immobilizing a wafer in the chamber of the plasma processing device 400 based on measured current and voltage values. Thus, it is necessary to reduce error of the measured current and voltage values to an extremely small range, as well as minimize differences in characteristics between devices. Consequently, detected values of the high-frequency measuring device 300 are required to be calibrated at high accuracy.

SUMMARY OF THE INVENTION

With the foregoing in view, an object of the present invention is to provide a method for calibrating a voltage and a current detected by a high-frequency measuring device with high accuracy, and a high-frequency measuring device capable of carrying out that calibration.

The present invention devises the following technical means for solving the above-mentioned problems.

A calibration method provided according to a first aspect of the present invention is a method for calibrating voltage values and current values of a high-frequency measuring device that is connected to a connection point between a load including a plasma processing device and a high-frequency power supply device for supplying high-frequency electrical power to the load, wherein the measuring device is configured to detect a high-frequency voltage and a high-frequency current at the connection point, and calculates an impedance as viewed from the connection point towards a load side based on the detected voltage and current values. The method of the first aspect comprises: a first step of calculating a first parameter for calibrating the voltage and current values based on an impedance calculated when the high-frequency measuring device is connected to a first set of three reference loads and impedances of the first set of three reference loads; a second step of carrying out plasma processing by connecting the high-frequency measuring device to a load to be measured, calibrating the detected voltage and current values using the first parameter, and calculating an impedance as viewed from the connection point towards the load side based on the calibrated voltage and current values; a third step of determining three impedances that encompass, when displayed on a Smith chart, a range narrower than a range encompassed by the impedances of the first set of three reference loads, wherein the narrower range includes the impedances calculated in the second step; a fourth step of calculating a second parameter for further calibrating the voltage and current values calibrated using the first parameter, based on an impedance calculated when the high-frequency measuring device is connected to a second set of three reference loads respectively having three impedances and the impedances of the second set of three reference loads; and a fifth step of connecting the high-frequency measuring device to the load to be measured and calibrating detected voltage and current values using the first parameter and the second parameter.

Examples of high-frequency measuring devices may include high-frequency measuring devices connected to plasma processing devices and measuring high-frequency parameters for monitoring the plasma processing device, and high-frequency measuring devices provided within an impedance matching device and measuring high-frequency parameters for controlling a matching operation. In addition, examples of detected voltage and current values include digitally converted voltage and current values, effective voltage and current values, and maximum voltage and current values.

In a preferred embodiment of the present invention, the calibration method further comprises: a sixth step of calculating an impedance as viewed from the connection point towards the load side based on the voltage and current values calibrated in the fifth step; a seventh step of determining three impedances that include the impedance calculated in the sixth step and encompass a range narrower than a range encompassed by the impedances of the second set of three reference loads; an eighth step of calculating a third parameter for further calibrating the voltage and current values calibrated using the first and second parameters based on an impedance calculated when the high-frequency measuring device is connected to a third set of three reference loads respectively having the three impedances determined by the seventh step and the impedances of the third set of three reference loads, and setting the third parameter in the high-frequency measuring device; and a ninth step of connecting the high-frequency measuring device to the load to be measured and calibrating detected voltage and current values using the first, second and third parameters.

In a preferred embodiment of the present invention, one of the reference loads among the first set of three reference loads has an impedance equal to a characteristic impedance of the high-frequency measuring device.

A high-frequency measuring device provided according to a second aspect of the present invention is a high-frequency measuring device adapted to be connected to a connection point between a load including a plasma processing device and a high-frequency power supply device for supplying high-frequency electrical power to the load. The high-frequency measuring device comprises: a voltage detector for detecting high-frequency voltage at the connection point; a current detector for detecting high-frequency current at the measurement point; a calibrator for calibrating a voltage value detected by the voltage detector and a current value detected by the current detector; and an impedance calculator for calculating an impedance as viewed from the connection point towards a load side based on the voltage and current values calibrated by the calibrator, wherein the calibrator is provided with a first calibration unit for calibrating the detected voltage and current values using a first parameter calculated based on an impedance calculated by the impedance calculator when the high-frequency measuring device is connected to a first set of three reference loads and impedances of the first set of three reference loads; and a second calibration unit for further calibrating the voltage and current values calibrated by the first calibration unit, using a second parameter calculated based on an impedance calculated by the impedance calculator when the high-frequency measuring device is connected to a second set of three reference loads that encompass a range narrower than a range encompassed by the impedances of the first set of three reference loads and impedances of the second set of three reference loads in the case of displaying on a Smith chart.

In a preferred embodiment of the present invention, the calibrator is further provided with a third calibration unit for further calibrating the voltage and current values calibrated by the second calibration unit, using a third parameter calculated based on an impedance calculated by the impedance calculator when the high-frequency measuring device is connected to a third set of three reference loads that encompass a range narrower than a range encompassed by the impedances of the second set of three reference loads and impedances of the third set of three reference loads in the case of displaying on a Smith chart.

In a preferable embodiment of the present invention, the calibrator is further provided with a fourth calibration unit for further calibrating the voltage and current values calibrated by the first calibration unit, using a fourth parameter calculated based on an impedance calculated by the impedance calculator when the high-frequency measuring device is connected to a fourth set of three reference loads that encompass a range narrower than a range encompassed by the impedances of the first set of three reference loads and impedances of the fourth set of three reference loads in the case of displaying on a Smith chart, and a judgment unit for judging whether or not an impedance calculated by the impedance calculator is within the range encompassed by the impedances of the second set of three reference loads or within the range encompassed by the impedances of the fourth set of three reference loads in the case of displaying on a Smith chart, wherein calibration is carried out by the second calibration unit when the calculated impedance is judged by the judgment unit to be within the range encompassed by the impedances of the second set of three reference loads, and calibration is carried out by the fourth calibration unit when the calculated impedance is judged by the judgment unit to be within the range encompassed by the impedances of the fourth set of three reference loads.

In a preferred embodiment of the present invention, one of the reference loads among the first set of three reference loads has an impedance equal to a characteristic impedance of the high-frequency measuring device.

According to the present invention, an impedance as viewed from a connection point towards a load side is calculated based on calibrated voltage and current values. First, an impedance is calculated by detecting voltage and current values by connecting a load to be measured are calibrated according to a first parameter calculated based on a first set of three reference loads. Next, three impedances having a narrower range are determined based on the calculated impedance. Voltage and current values are then calibrated according to the first parameter and a second parameter calculated based on a second set of three reference loads respectively having the three impedances.

Since the second parameter is determined in order to calibrate using only an impedance range that is narrower than that of the first parameter, in the case an impedance is within this range, calibration accuracy becomes sufficiently high due to the second parameter. Thus, detected voltage and current values can be calibrated with high accuracy.

Other characteristics and advantages of the present invention will become clearer from the detailed explanation provided below with reference to the appended drawings.

DESCRIPTION OF THE PREFERRED EMBODIMENTS

The following provides a detailed explanation of embodiments of the present invention with reference to the appended drawings by using as an example the case of a high-frequency measuring device used to monitor a plasma processing device.

Figure 1:
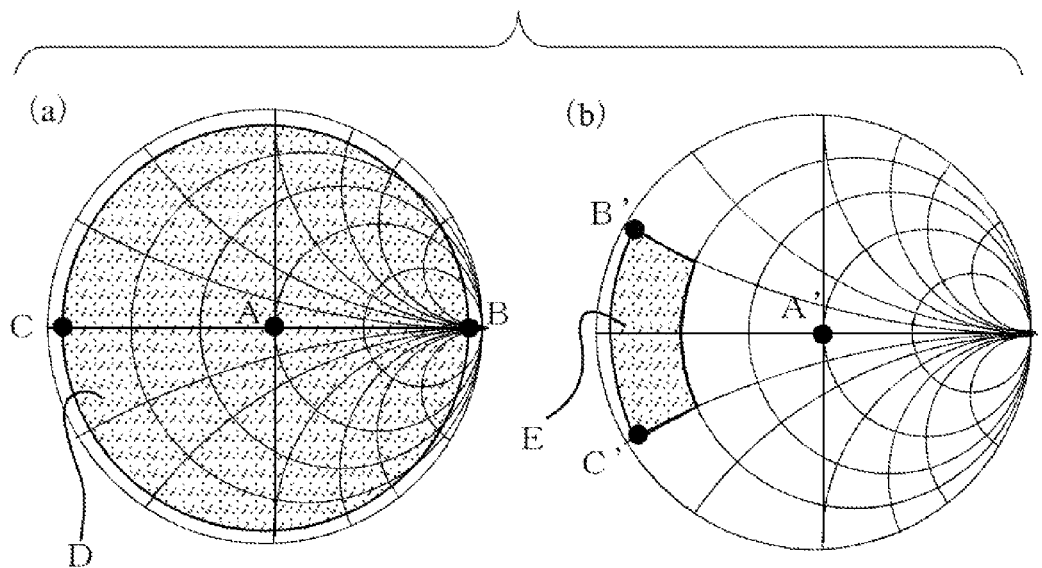
FIG. 1 is a drawing for explaining the concept of the calibration method according to the present invention.

FIG. 1 is a drawing for explaining the concept of the calibration method according to the present invention, and indicates the locations of each impedance on a Smith chart.

Points A, B and C in FIG. 1(*a*) respectively indicate the locations of an impedance of 50Ω that is the characteristic impedance, an impedance close to open-circuit impedance (an infinitely large impedance) and an impedance close to short-circuit impedance (a zero impedance). A calibration parameter calculated by using points A, B and C as references enables calibration to be carried out over a range D encompassed by points A, B and C, namely over nearly the entire range of the impedances on the Smith chart. However, since an impedance of a plasma processing device in which the high-frequency measuring device actually carries out measurements (to be referred to as the "device to be measured") does not change over that wide an impedance range, it is not necessary to carry out calibration over nearly the entire impedance range. In other words, highly accurate calibration is expected to be carried out over a narrow impedance range rather than carrying out calibration of low accuracy over a wide impedance range.

For example, in the case an impedance of a device to be measured changes only within range E in FIG. 1(b), it is not necessary to consider calibrating at an impedance other than over the range E. In this case, if a calibration parameter is calculated using the impedances of points A', B' and C' that encompass range E as references and calibration is carried out with that calibration parameter, calibration can be carried out more accurately than in the case of carrying out calibration with a calibration parameter calculated by using the impedances of points A, B and C as references. However, in the case an impedance of the device to be measured is outside the range encompassed by points A', B' and C', the accuracy of calibration becomes lower than in the case of calibrating with a calibration parameter calculated by using the impedances of points A, B and C as references. Thus, it is necessary to determine points A', B' and C' so as to include the range of change of the impedance of the device to be measured.

The present invention carries out multistage calibration consisting of confirming the range of change of an impedance of a device to be measured by calibrating with a calibration parameter that allows calibration at low accuracy over a wide impedance range, and then calibrating with a calibration parameter that allows calibration at high accuracy only over that range of change.

First, in order to confirm the range of change of the impedance of a device to be measured, a first calibration parameter is calculated and set that allows calibration to be carried out at low accuracy over a wide impedance range. The method used to calculate the first calibration parameter will be described later. Next, a high-frequency measuring device is connected to the device to be measured, and an impedance is measured during plasma processing. This measured impedance value is calculated based on current and voltage values calibrated with the first calibration parameter. Thus, although accuracy is low, the impedance range during plasma processing can be confirmed. Next, a second calibration parameter is calculated and set that allows calibration to be carried out at high accuracy only over a narrow impedance range that includes the confirmed impedance range. The method used to calculate the second calibration parameter will be described later. Highly accurate calibration can be carried out by calibrating detected current and voltage values with the first calibration parameter and the second calibration parameter.

Figure 2:
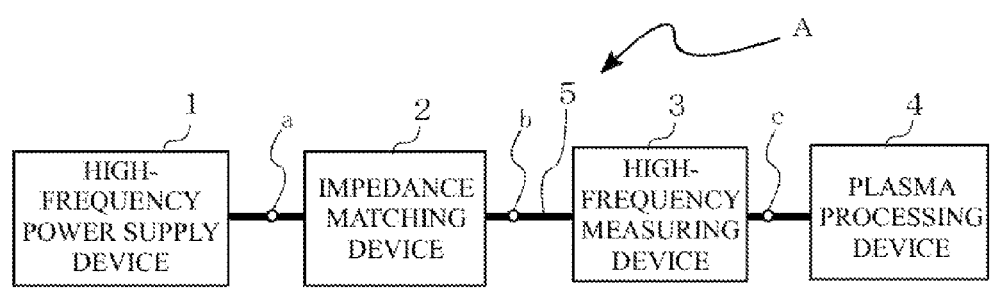
FIG. 2 is a block diagram for explaining the configuration of a plasma processing system that uses a high-frequency measuring device according to a first embodiment.

FIG. 2 is a block diagram for explaining the configuration of a plasma processing system using a high-frequency measuring device according to a first embodiment.

A plasma processing system A carries out processing such as plasma etching by supplying high-frequency electrical power to a processed article such as a semiconductor wafer or liquid crystal substrate. As shown in this drawing, the plasma processing system A is provided with a high-frequency power supply device 1, an impedance matching device 2, a high-frequency measuring device 3 and a plasma processing device 4. The impedance matching device 2 is connected to the high-frequency power supply device 1 via a transmission line composed of, for example, a coaxial cable, and the plasma processing device 4 is connected to the impedance matching device 2 via a transmission line 5 composed of, for example, rod-like copper. The high-frequency measuring device 3 is installed on the transmission line 5. Furthermore, the plasma processing system A is composed as a system having a characteristic impedance of 50Ω.

The high-frequency power supply device 1 is a power supply device that supplies high-frequency electrical power and is capable of outputting high-frequency electrical power having a frequency of, for example, several hundred kHz or more.

The impedance matching device 2 matches an impedance of the high-frequency power supply device 1 and the plasma processing device 4. The impedance matching device 2 is provided with a variable reactance element not shown (such as a variable capacitor or variable inductor), and changes an impedance by changing the reactance of the variable reactance element. The impedance matching device 2 converts an impedance as viewed from an output end b of the impedance matching device 2 towards the load side so that an impedance as viewed from an input end a of the impedance matching device 2 towards the load side becomes characteristic impedance.

Furthermore, a high-frequency measuring device not shown is provided on the power supply side within the impedance matching device 2. This high-frequency measuring device measures an impedance as viewed from the input end a of the impedance matching device 2 towards the load side, and the impedance matching device. 2 changes the reactance of the variable reactance element so that the measured impedance becomes the characteristic impedance.

The plasma processing device 4 is a device for processing a processed article such as a semiconductor wafer or liquid crystal substrate using a method such as etching or CVD. Furthermore, although not shown in the drawing, the plasma processing device 4 is provided with a container (chamber) for sealing a prescribed gas such as nitrogen gas or argon gas for generating plasma, and a pair of electrodes for supplying high-frequency electrical power from the high-frequency power supply device 1 to gas within the chamber.

The high-frequency measuring device 3 is a so-called RF sensor that measures high-frequency parameters such as an impedance and a reflection coefficient of the plasma processing device 4 and a high-frequency voltage, a high-frequency current, a forward power and a reflected power at an input end c of the plasma processing device 4 in order to monitor the status of the plasma processing device 4 during plasma processing. Furthermore, although the measured impedance is an impedance as viewed from the point where high-frequency voltage and high-frequency current are detected (measurement point) towards the load side, since the measurement point is in the vicinity of the input end c of the plasma processing device 4, it is equivalent to the impedance of the plasma processing device 4.

Figure 3:
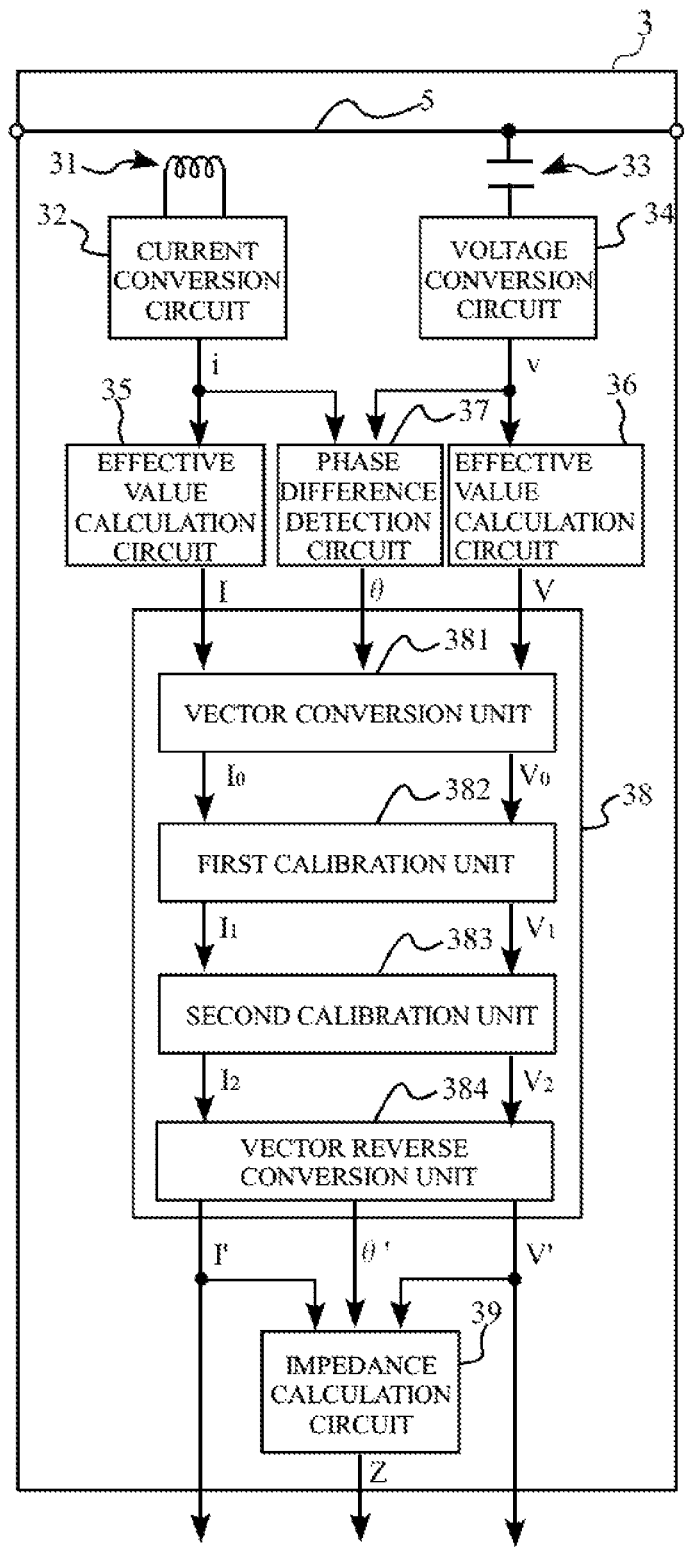
FIG. 3 is a block diagram for explaining the internal configuration of a high-frequency measuring device according to a first embodiment.

FIG. 3 is a block diagram for explaining the internal configuration of the high-frequency measuring device 3.

As shown in the drawing, the high-frequency measuring device 3 is provided with a current transformer unit 31, a current conversion circuit 32, a capacitor unit 33, a voltage conversion circuit 34, effective value calculation circuits 35 and 36, a phase difference detection circuit 37, a calibration circuit 38 and an impedance calculation circuit 39.

The current transformer unit 31 detects current corresponding to high-frequency current flowing to the transmission line 5, and the detected current is output to the current conversion circuit 32. The current conversion circuit 32 converts the input current to a digital current signal i and outputs that current signal i to the effective value calculation circuit 35 and the phase difference detection circuit 37. The capacitor unit 33 detects voltage corresponding to high-frequency voltage generated in the transmission line 5, and outputs the detected voltage to the voltage conversion circuit 34. The voltage conversion circuit 34 converts the input voltage to a digital voltage signal v and outputs that voltage signal to the effective value calculation circuit 36 and the phase difference detection circuit 37.

The effective value calculation circuit 35 calculates an effective current value. The effective value calculation circuit 35 calculates an effective current value I from the current signal i input from the current conversion circuit 32, and outputs the effective current value I to the calibration circuit 38. The effective value calculation circuit 36 calculates an effective voltage value. The effective value calculation circuit 36 calculates an effective voltage value V from the voltage signal v input from the voltage conversion circuit 34, and outputs the effective voltage value V to the calibration circuit 38. The phase difference detection circuit 37 detects the phase difference of current and voltage. The phase difference detection circuit 37 calculates the phase difference θ from the current signal i input from the current conversion circuit 32 and the voltage signal v input from the voltage conversion circuit 34, and outputs the phase difference θ to the calibration circuit 38.

The calibration circuit 38 carries out calibration of the effective current value I, the effective voltage value V and the phase difference θ. The calibration circuit 38 calibrates the effective current value I input from the effective value calculation circuit 35, the effective voltage value V input from the effective value calculation circuit 36 and the phase difference θ input from the phase difference detection circuit 37, and outputs a calibrated effective current value I', a calibrated effective voltage value V' and a calibrated phase difference θ' to the impedance calculation circuit 39.

The calibration circuit 38 is provided with a vector conversion unit 381, a first calibration unit 382, a second calibration unit 383 and a vector reverse conversion unit 384, and carries out two-stage calibration on current and voltage vectors. The vector conversion unit 381 calculates a current signal $I_0$ vector, and a voltage signal $V_0$ vector from the input effective current value I, the effective voltage value V and the phase difference θ, and outputs the current signal and voltage signal vectors to the first calibration unit 382. The current signal $I_0$ and the voltage signal $V_0$ are calculated with $I_0=I+j0$ and $V_0=V\cos\theta+jV\sin\theta$ using the phase of the current signal I0 as a reference (real axis, virtual component 0). The first calibration unit 382 carries out a first stage of calibration on the current signal $I_0$ and the voltage signal $V_0$ input from the vector conversion unit 381 using a first calibration parameter X recorded in memory not shown, and outputs the current signal $I_1$ and voltage signal $V_1$ to the second calibration unit 383 following calibration. The second calibration unit 383 carries out a second stage of calibration on the current signal $I_1$ and voltage signal $V_1$ input from the first calibration unit 382 using a second calibration parameter X' recorded in memory, and outputs the current signal $I_2$ and voltage signal $V_2$ to the vector reverse conversion unit 384 following calibration. The vector reverse conversion unit 384 calculates and outputs the calibrated effective current value I', effective voltage value V' and phase difference θ' from the calibrated current signal $I_2$ and voltage signal $V_2$ input from the second calibration unit 383.

The first calibration parameter X and the second calibration parameter X' are respectively calculated based on three reference loads and recorded in memory. The following provides an explanation of a method for calculating the first calibration parameter X.

Figure 4:
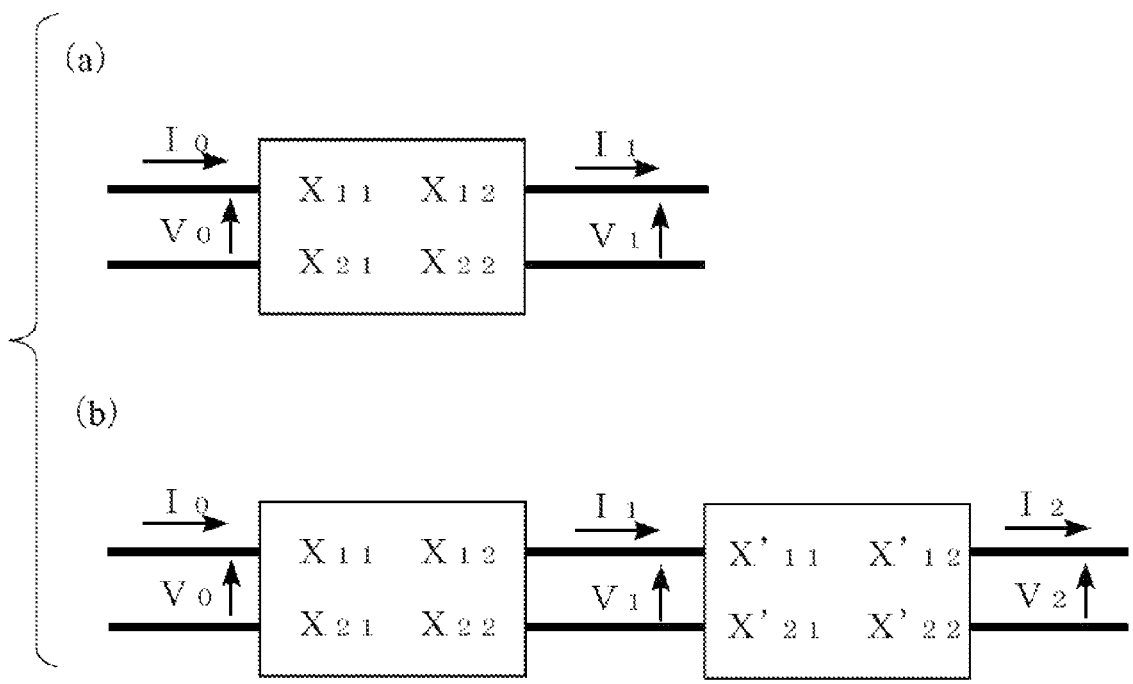
FIG. 4 is a drawing for explaining a first calibration parameter and a second calibration parameter.

When the relationship between the current signal $I_0$ and voltage signal $V_0$ output from the vector conversion unit 381 and the high-frequency current flowing to the transmission line 5 and the high-frequency voltage generated in the transmission line 5 is replaced with a two-terminal pair network, the first calibration parameter X that calibrates the current signal $I_0$ and the voltage signal $V_0$ to the current signal $I_1$ and the voltage signal $V_1$ can be considered to be a two-dimensional vector matrix as shown in FIG. 4(a).

Respective elements $X_{11}$, $X_{12}$, $X_{21}$ and $X_{22}$ of the first calibration parameter X can be calculated by connecting the high-frequency measuring device 3 to three reference loads, measuring the impedance of each with the high-frequency measuring device 3, and using these measured impedance values and the true values of the impedances of the three reference loads. Furthermore, in order to carry out these calculations, absolute values of voltage and current are required for use as references. Highly accurate electrical power measured values are required in order to use the absolute values of voltage and current as references. Measuring by connecting a load for which reflected power is zero is the best way to measure highly accurate electrical power measured values. Thus, in the present embodiment, a reference load having an impedance equal to the characteristic impedance (namely, 50Ω) is selected for one of the reference loads in order to realize zero reflected power. Furthermore, since the reason for using a load having the characteristic impedance as one of the reference loads is to measure highly accurate electrical power measured values as previously described, a load other than that having the characteristic impedance may be used provided it enables measurement of electrical power measured values with high accuracy.

In the case of actually connecting the high-frequency measuring device 3 to a reference load and measuring an impedance of the reference load, the high-frequency measuring device 3 is unable to measure an impedance at the input end of the reference load, and an impedance of the high-frequency measuring device 3 per se is included in the measured impedance. Thus, the first calibration parameter X cannot be calculated using the impedance of the reference load only as the true value of impedance. In the present embodiment, the total of the connected loads and the high-frequency measuring device 3 is treated as the reference load, the impedance of that reference load is measured with an impedance analyzer, and the first calibration parameter X is calculated by using that measured value as the true value of the reference load.

Furthermore, loads respectively having an impedance close to the open-circuit impedance and the short-circuit impedance are preferably used for two of the reference loads in order to include as wide an impedance range as possible. On the other hand, in the case of using a load having an impedance excessively close to the open-circuit impedance or the short-circuit impedance as a reference load, one of the voltage value or current value detected by the high-frequency measuring device 3 becomes extremely small in comparison with the other. In this case, the respective elements $X_{11}$, $X_{12}$, $X_{21}$ and $X_{22}$ of the first calibration parameter X cannot be suitably calculated. Thus, in the present embodiment, loads having a magnitude of the reflection coefficient of, for example, 0.9 or less are used as reference loads.

Figure 5:
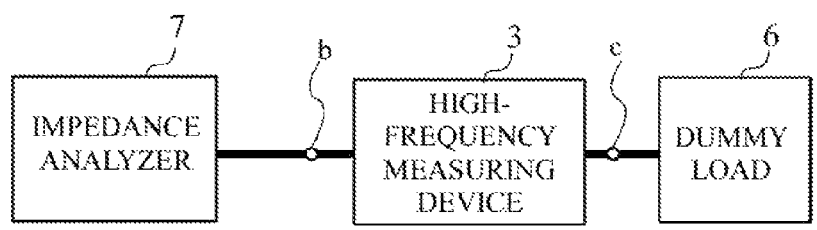
FIG. 5 is a drawing for explaining a method of measuring an impedance of a reference load that is carried out for calculating each element of a calibration parameter.

FIG. 5 is a drawing for explaining a method of measuring an impedance of a reference load that is carried out to calculate the respective elements $X_{11}$, $X_{12}$, $X_{21}$ and $X_{22}$ of the first calibration parameter X.

As shown in the drawing, this measurement is carried out by connecting a dummy load 6 to an output end c of the high-frequency measuring device 3, and connecting an impedance analyzer 7 to an input end b of the high-frequency measuring device 3.

The dummy load 6 is a load device for reproducing a prescribed reference load, and converts an impedance as viewed from the input end b of the high-frequency measuring device 3 towards the load side, namely the total impedance of the dummy load 6 and the high-frequency measuring device 3, to a prescribed reference load impedance. The dummy load changes an impedance by changing the reactance of a variable reactance element not shown (such as a variable capacitor or variable inductor). The dummy load 6 is set in advance so as to be able to reproduce prescribed reference loads consisting of a reference load having the characteristic impedance (50Ω) and two reference loads having reflection coefficients of 0.9 or less that are close to the open-circuit impedance and the short-circuit impedance, respectively. Furthermore, instead of reproducing the three prescribed reference loads by connecting the dummy load 6 and switching the settings thereof, three loads for reproducing the prescribed reference loads may be connected in sequence.

The impedance analyzer 7 is used to measure an impedance, and measures an impedance as viewed from the input end b of the high-frequency measuring device 3 towards the load side, namely an impedance of a reference load.

Measurement of the impedances of the reference loads for calculating the first calculation parameter X is carried out by reproducing each reference load and measuring each impedance with the impedance analyzer 7 and the high-frequency measuring device 3. Furthermore, the impedance analyzer 7 need not be used if the method used allows the obtaining of true values of the impedance measured by the high-frequency measuring device 3.

The respective elements $X_{11}$, $X_{12}$, $X_{21}$ and $X_{22}$ of the first calibration parameter X can be calculated from the impedance measured values of the three reference loads measured by the high-frequency measuring device 3 and the true impedance values of the three reference loads. The current signal $I_0$ and the voltage signal $V_0$ can be converted to the calibrated current signal $I_1$ and calibrated voltage signal $V_1$ according to FIG. 4(a) using the calculated first calibration parameter X. Namely, the calibrated current signal $I_1$ and calibrated voltage signal $V_1$ can be calculated according to the following equations (6) and (7) derived from FIG. 4(a).

$$\begin{bmatrix} V_0 \\ V_1 \end{bmatrix} = \begin{bmatrix} X_{11} & X_{12} \\ X_{21} & X_{22} \end{bmatrix} \begin{bmatrix} I_0 \\ -I_1 \end{bmatrix} \quad (6)$$

$$V_0 = X_{11} I_0 - X_{12} I_1$$
$$V_1 = X_{21} I_0 - X_{22} I_1$$
$$I_1 = \frac{X_{11}}{X_{12}} I_0 - \frac{1}{X_{12}} V_0$$

$$V_1 = \frac{(X_{12} X_{21} - X_{11} X_{22})}{X_{12}} I_0 + \frac{X_{22}}{X_{12}} V_0 \quad (7)$$

The method for calculating the second calibration parameter X' is similar to the method used to calculate the first calibration parameter X as described above. Similar to that described above, when the relationship between the current signal $I_1$ and voltage signal $V_1$ output from the first calibration unit 382 and the high-frequency current flowing to the transmission line 5 and the high-frequency voltage generated in the transmission line 5 is replaced with a two-terminal pair network, the second calibration parameter X' that calibrates the current signal $I_1$ and the voltage signal $V_1$ to the current signal $I_2$ and the voltage signal $V_2$ can be considered to be a two-dimensional matrix as shown on the right side in FIG. 4(b). Furthermore, the entire FIG. 4(b) indicates the calibration circuit 38 that converts the current signal $I_0$ and the voltage signal $V_0$ according to the two-dimensional vector matrices of the first calibration parameter X and the second calibration parameter X', and outputs the calibrated current signal $I_2$ and voltage signal $V_2$.

The respective elements $X'_{11}$, $X'_{12}$, $X'_{21}$ and $X'_{22}$ of the second calibration parameter X' are also calculated from the measured impedance values of three reference loads respectively measured by the high-frequency measuring device 3 when the three reference loads are reproduced and from the true impedance values of the three reference loads in the same manner as previously described.

Furthermore, although it is necessary for one of the three reference loads to have the characteristic impedance (50Ω) in the same manner as previously described, the remaining two reference loads are determined based on the range of change of the impedance during plasma processing of the plasma processing device 4. Namely, points B' and C' are determined so that a narrow impedance range E that includes that range of change of the impedance is encompassed by a point A' that indicates the characteristic impedance (see FIG. 1(b)), and loads having the impedances indicated by points B' and C' are determined for the reference loads.

The current signal $I_1$ and the voltage signal $V_1$ can be converted to the calibrated current signal $I_2$ and calibrated voltage signal $V_2$ according to FIG. 4(b) using the calculated second calibration parameter X'. Namely, the calibrated current signal $I_2$ and calibrated voltage signal $V_2$ can be calculated according to the following equations (8) and (9) derived from FIG. 4(b).

$$\begin{bmatrix} V_1 \\ V_2 \end{bmatrix} = \begin{bmatrix} X'_{11} & X'_{12} \\ X'_{21} & X'_{22} \end{bmatrix} \begin{bmatrix} I_1 \\ -I_2 \end{bmatrix} \quad (8)$$

$$V_1 = X'_{11} I_1 - X'_{12} I_2$$
$$V_2 = X'_{21} I_1 - X'_{22} I_2$$
$$I_2 = \frac{X'_{11}}{X'_{12}} I_1 - \frac{1}{X'_{12}} V_1$$

$$V_2 = \frac{(X'_{12} X'_{21} - X'_{11} X'_{22})}{X'_{12}} I_1 + \frac{X'_{22}}{X'_{12}} V_1 \quad (9)$$

The impedance calculation circuit 39 is used to calculate an impedance. The impedance calculation circuit 39 calculates and outputs an impedance Z according the previously described equations (1) to (3) from the calibrated effective current value I', effective voltage value V' and phase difference θ' input from the calibration circuit 38. Furthermore, although the high-frequency measuring device 3 also calculates and outputs high-frequency parameters such as forward power Pf and reflected power Pr, a description of a configuration that calculates these parameters is omitted from the drawings.

Figure 6:
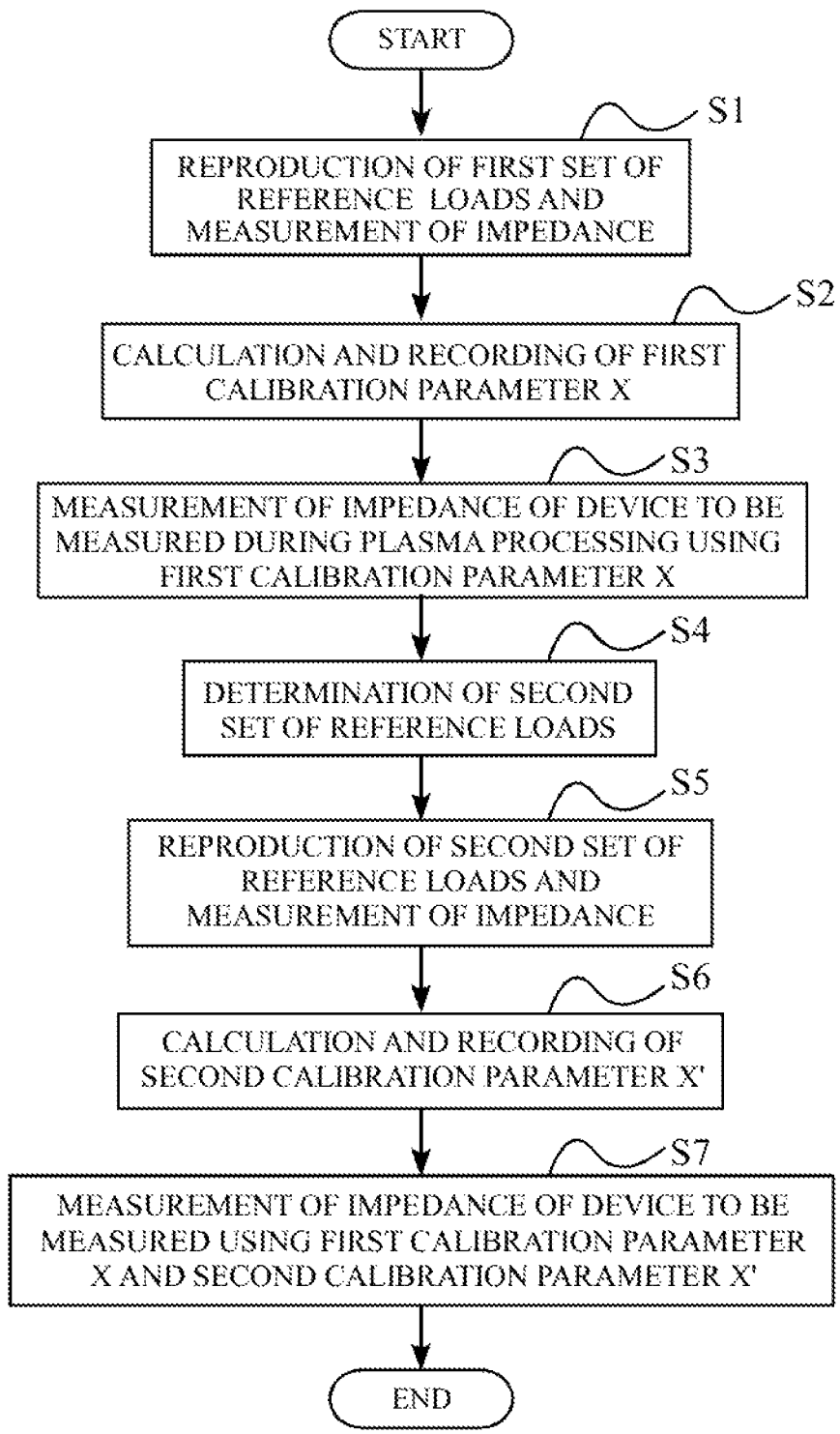
FIG. 6 is a flow chart for explaining the procedure of a calibration method of a high-frequency measuring device according to a first embodiment.

Next, an explanation is provided of a procedure for carrying out calibration of the high-frequency measuring device 3 with reference to the flow chart shown in FIG. 6.

FIG. 6 is a flow chart for explaining a procedure for calibrating the high-frequency measuring device 3. This flow chart indicates a processing procedure for carrying out calibration of the detected current signal $I_0$ and voltage signal $V_0$ in the case of measuring an impedance of the plasma processing device 4 (device to be measured) with the high-frequency measuring device 3.

First, the dummy load 6 and the impedance analyzer 7 are connected to the high-frequency measuring device 3 (see FIG. 5), a first set of reference loads is reproduced by the dummy load 6, and an impedance is respectively measured with the impedance analyzer 7 and the high-frequency measuring device 3 (S1). Furthermore, since three reference loads are provided for the first set of reference loads, each first reference load is reproduced and the impedance of each is respectively measured by the impedance analyzer 7 and the high-frequency measuring device 3. The first set of reference loads consists of a reference load having the characteristic impedance (50Ω), and two reference loads having reflection coefficients of 0.9 or less and the impedances near the open-circuit impedance and the short-circuit impedance, respectively.

The first calibration parameter X is calculated from the respective impedances of the first set of three reference loads measured by the impedance analyzer 7 and the high-frequency measuring device 3 in step S1, and then recorded in a memory not shown of the high-frequency measuring device 3 (S2). In the present embodiment, an arithmetic processing circuit not shown of the high-frequency measuring device 3 records the impedance calculated with the impedance calculation circuit 39 and the impedance input from the impedance analyzer 7 in memory, calculates each of the elements of the first calibration parameter X after measuring the first set of three reference loads, and then records the elements in memory. Furthermore, calculation of the first calibration parameter X is not limited to the case of being carried out by the arithmetic processing circuit of the high-frequency measuring device 3, but rather, for example, may be carried out separately by a worker. In this case, the first calibration parameter is recorded in memory by the worker inputting the first calibration parameter X with input means not shown of the high-frequency measuring device 3.

Next, the high-frequency measuring device 3 is installed in the actually used plasma processing system A (see FIG. 2), and the impedance of the plasma processing device 4 (device to be measured) during actual plasma processing is measured (S3). At this time, the high-frequency measuring device 3 calibrates the current signal $I_0$ and the voltage signal $V_0$ with the first calibration parameter X recorded in memory, and calculates the impedance Z based on the calibrated current signal $I_1$ and voltage signal $V_1$. Thus, although the impedance Z measured by the high-frequency measuring device 3 is not highly accurate, it can be trusted to a certain degree.

The range of change of the impedance of the plasma processing device 4 during plasma processing is confirmed from the impedance measured by the high-frequency measuring device 3 in step S3 followed by determination of the second set of reference loads (S4). One of the second set of reference loads is a reference load having the characteristic impedance (50Ω), while the remaining two reference loads are determined based on the range of change of the impedance during plasma processing of the plasma processing device 4. In the present embodiment, an arithmetic processing circuit not shown of the high-frequency measuring device 3 determines the impedances of the remaining two reference loads based on the impedance Z calculated with the impedance calculation circuit 39. Furthermore, determination of the impedances of the remaining two reference loads is not limited to the case of being carried out by the arithmetic processing circuit of the high-frequency measuring device 3, but rather, for example, may be carried out separately by a worker based on measured values of the impedance.

Next, the dummy load 6 and the impedance analyzer 7 are again connected to the high-frequency measuring device 3 (see FIG. 5), the second set of reference loads is reproduced by the dummy load 6, and the impedances thereof are respectively measured by the impedance analyzer 7 and the high-frequency measuring device 3 (S5). Furthermore, since three reference loads are provided for the second set of reference loads, each reference load of the second set of reference loads is reproduced, and the impedance of each is respectively measured by the impedance analyzer 7 and the high-frequency measuring device 3.

The second calibration parameter X' is calculated from the respective impedances of the second set of three reference loads measured by the impedance analyzer 7 and the high-frequency measuring device 3 in step S5, and then recorded in memory of the high-frequency measuring device 3 (S6). In the present embodiment, an arithmetic processing circuit of the high-frequency measuring device 3 records the impedance calculated with the impedance calculation circuit 39 and the impedance input from the impedance analyzer 7 in memory, calculates each of the elements of the second calibration parameter X' after measuring the second set of three reference loads, and then records the elements in memory. Furthermore, calculation of the second calibration parameter X' is not limited to the case of being carried out by the arithmetic processing circuit of the high-frequency measuring device 3, but rather, for example, may be carried out separately by a worker. In this case, the second calibration parameter X' is recorded in memory by the worker inputting the second calibration parameter X' with input means not shown of the high-frequency measuring device 3.

Next, the high-frequency measuring device 3 is again installed in the actually used plasma processing system A (see FIG. 2), and the impedance of the plasma processing device 4 (device to be measured) during actual plasma processing is measured (S7). At this time, the high-frequency measuring device 3 calibrates the current signal $I_0$ and the voltage signal $V_0$ with the first calibration parameter X and the second calibration parameter X' recorded in memory, and calculates the impedance Z from the effective current value I', the effective voltage value V' and the phase difference θ' based on the calibrated current signal $I_2$ and voltage signal $V_2$. Since the accuracy of calibration by the second calibration parameter X' is sufficiently high, the current signal $I_0$ and the voltage signal $V_0$ can be calibrated with high accuracy. Thus, the effective current value I' and the effective voltage value V' measured by the high-frequency measuring device 3 as well as the impedance Z are highly accurate and reliable.

Furthermore, the calibration processing procedure described above is used in the case the first calibration parameter X and the second calibration parameter X' are not recorded in memory of the high-frequency measuring device 3. It is not necessary to repeatedly carry out steps S1 and S2 of this processing procedure, but rather is only required to be carried out once to record the first calibration parameter X in memory. This processing may also be carried out by the manufacturer during production of the high-frequency measuring device 3. On the other hand, the processing of step S3 and beyond is required to be carried out each time the contents of plasma processing (such as the type of gas used or gas pressure) or the plasma processing device 4 installed with the high-frequency measuring device 3 changes.

As has been described above, in the present invention, calibration is carried out in two stages. Namely, calibration is first carried out with the first calibration parameter X that allows calibration at low accuracy over a wide impedance range to confirm the range of change of the impedance of a device to be measured, after which calibration is carried out with the second calibration parameter X' that allows calibration at high accuracy only over the range of change. Since the first calibration parameter X allows calibration to be carried out at low accuracy over a wide impedance range, the range of change of the impedance of a device to be measured, for which the location thereof is initially unknown, can be confirmed. Since the second calibration parameter X' is determined in order to carry out calibration only over an impedance range that is narrower than that of the first calibration parameter X, in the case an impedance is within that range, accuracy of calibration carried out according to the second calibration parameter X' is sufficiently high. Thus, detected voltage and current can be calibrated with high accuracy.

Furthermore, although the case of carrying out calibration in two stages is explained in the present embodiment, calibration is not limited to that carried out in two stages. Increasing the number of calibration stages makes it possible to further increase the accuracy of calibration. The following provides an explanation of the case of carrying out calibration in three stages as a second embodiment of the present invention.

Figure 7:
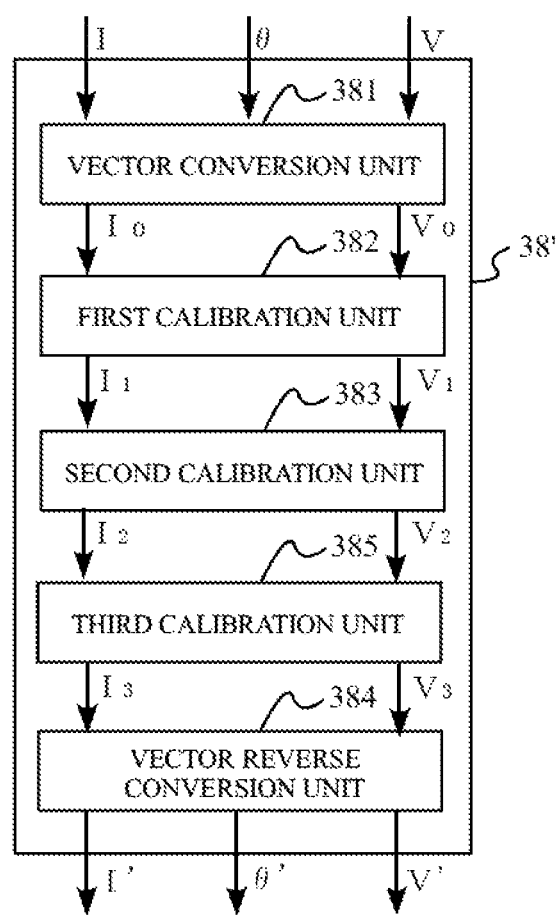
FIG. 7 is a block diagram for explaining the internal configuration of a calibration circuit of a high-frequency measuring device according to a second embodiment.

FIG. 7 is a block diagram for explaining the internal configuration of a calibration circuit of a high-frequency measuring device according to the second embodiment. Furthermore, in this drawing, the same reference symbols are used to indicate those elements that are similar or identical to the calibration circuit 38 of the high-frequency measuring device 3 shown in FIG. 3. A calibration circuit 38' shown in FIG. 7 differs from the calibration circuit 38 shown in FIG. 3 in that it is provided with a third calibration unit 385.

The third calibration unit 385 carries out a third stage of calibration on the current signal $I_2$ and voltage signal $V_2$ input from the second calibration unit 383 using a third calibration parameter X" recorded in memory, and outputs a current signal $I_3$ and voltage signal $V_3$ following calibration. The third calibration parameter X" is calculated using a similar method to the method used to calculate the second calibration parameter X'. Namely, the third calibration parameter X" is calculated from impedance measured values of a third set of three reference loads respectively measured by the high-frequency measuring device 3 when the respective reference loads are reproduced and the true impedance values of the three reference loads. One of the reference loads of the third set of three reference loads is a load having the characteristic impedance (50θ) in the same manner as previously described, while the remaining two reference loads are determined based on the range of change of the impedance during plasma processing of the plasma processing device 4. At this time, since the impedance of the plasma processing device 4 being measured is calculated from the current signal $I_2$ and voltage signal $V_2$ that have been calibrated with high accuracy using the first calibration parameter X and the second calibration parameter X', measured values are highly accurate and highly reliable. Thus, since a range of the impedance that includes the rate of change of the impedance can be set to a narrower range, the accuracy of calibration according to the third calibration parameter X" can be made to be higher than the accuracy of calibration according to the second calibration parameter X'.

In the case of the first and second embodiments as previously described, it is necessary to carry out the processing procedure of steps S3 to S6 of the flow chart shown in FIG. 6 each time the contents of plasma processing of the plasma processing device 4 (such as the type of gas used or gas pressure) are altered. The calibration processing procedure can be simplified if the second calibration parameter X' is recorded in memory for each type of processing of the plasma processing device 4, and the second calibration parameter X' is switched for each type of processing. The following provides an explanation of the case of recording the second calibration parameter X' for two types of processing as a third embodiment of the present invention.

Figure 8:
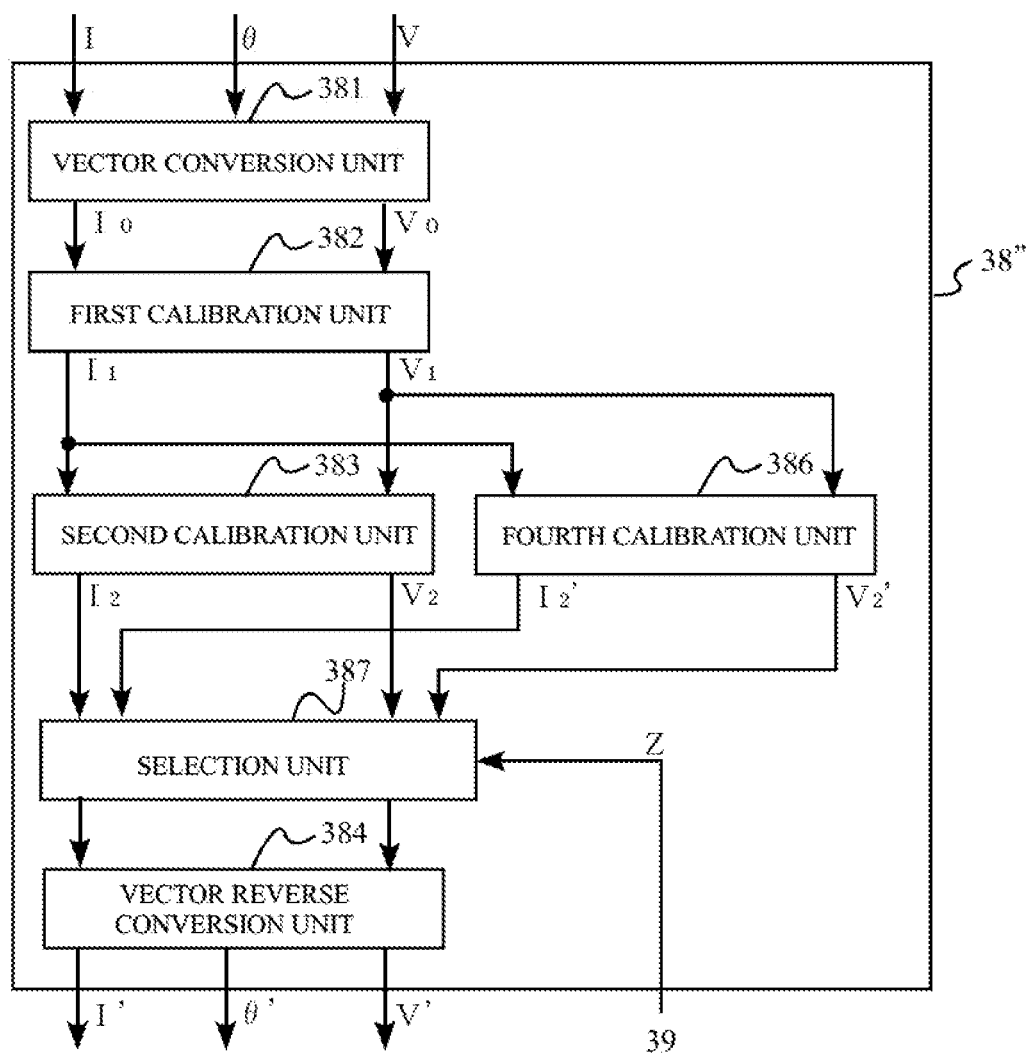
FIG. 8 is a block diagram for explaining the internal configuration of a calibration circuit of a high-frequency measuring device according to a third embodiment.

FIG. 8 is a block diagram for explaining the internal configuration of a calibration circuit of a high-frequency measuring device according to the third embodiment. Furthermore, in this drawing, the same reference symbols are used to indicate those elements that are similar or identical to the calibration circuit 38 of the high-frequency measuring device 3 shown in FIG. 3. A calibration circuit 38" shown in FIG. 8 differs from the calibration circuit 38 shown in FIG. 3 in that it is provided with a fourth calibration unit 386 and a selection unit 387.

The fourth calibration unit 386 carries out the second stage of calibration on the current signal $I_1$ and voltage signal $V_1$ input from the first calibration circuit 382 using a fourth calibration parameter X'" recorded in memory, and outputs a current signal $I_2$' and voltage signal $V_2$' following calibration. The fourth calibration parameter X'" is calculated using a similar method to the method used to calculate the second calibration parameter X'. However, since the contents of plasma processing of the plasma processing device 4 differ from those when the second calibration parameter X' was calculated, the range of change of the impedance of the plasma processing device 4 also differs. A fourth set of reference loads is determined based on this range of change of the impedance to calculate the fourth calibration parameter X'".

Figure 9:
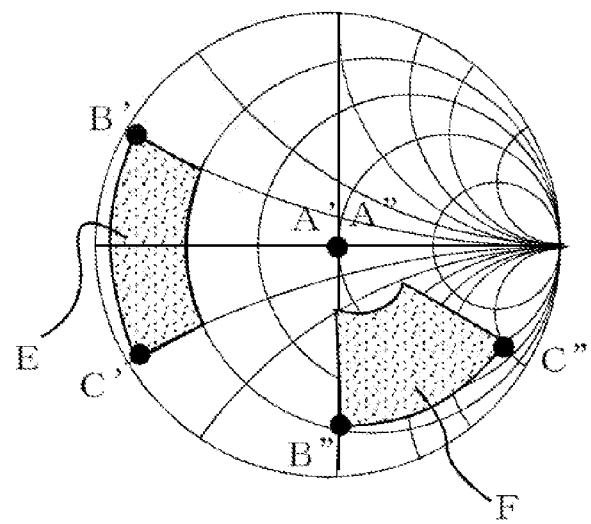
FIG. 9 is a drawing for explaining the location of each impedance on a Smith chart.
Figure 10:
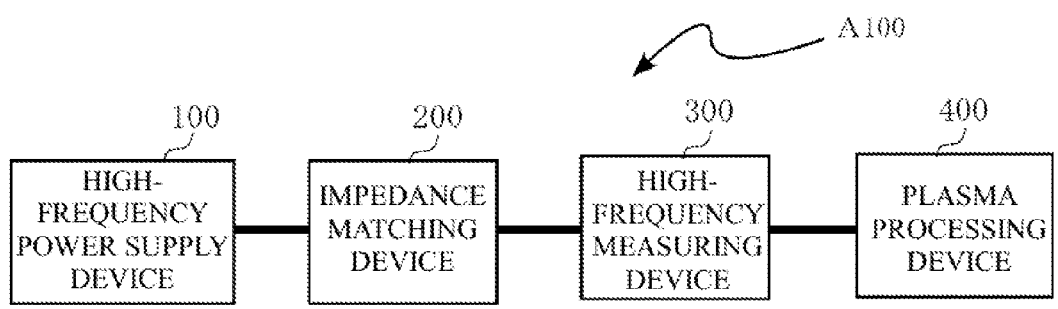
FIG. 10 is a block diagram showing the configuration of a typical plasma processing system.

FIG. 9 is a drawing for indicating the location of each impedance on a Smith chart. Points A', B' and C' encompassing the range E indicate the locations of the impedances of the second set of reference loads, while points A", B" and C" encompassing a range F indicate the locations of the impedances of the fourth set of reference loads. Furthermore, points A' and A" both indicate the locations of the characteristic impedance of 50Ω. In the case the impedance of the high-frequency measuring device 3 during plasma processing is within the range E, calibration can be carried out with high accuracy if the second calibration parameter X' is used that has been calculated by using the impedances of points A', B' and C' encompassing range E as references. In addition, in the case the impedance of the high-frequency measuring device 3 during plasma processing is within the range F, calibration can be carried out with high accuracy if the fourth calibration parameter X'" is used that has been calculated by using the impedances of points A", B" and C" encompassing range F as references.

The selection unit 387 selects which of the second calibration parameter X' and the fourth calibration parameter X'" is to be used in the second stage of calibration. The selection unit 387 judges whether the impedance Z is within the range E or the range F after being input with the impedance Z output from the impedance calculation circuit 39. In the case the impedance Z is judged to be within the range E, the calibrated current signal $I_2$ and voltage signal $V_2$ input from the second calibration unit 383 are output. On the other hand, if the impedance Z is judged to be within the range F, the calibrated current signal $I_2$' and voltage signal $V_2$' input from the fourth calibration unit 386 are output.

According to the third embodiment, the parameter used in the second stage of calibration can be automatically switched between the second calibration parameter X' and the fourth calibration parameter X'" based on the impedance Z output from the impedance calculation circuit 39. Thus, it is not necessary to carry out a calibration processing procedure each time the contents of plasma processing are altered. Furthermore, a worker may switch the calibration processing procedure manually corresponding to the contents of plasma processing instead of switching automatically based on the impedance Z output from the impedance calculation circuit 39. In addition, three or more types of parameters may be prepared for use in the second stage of calibration.

The high-frequency measuring device and high-frequency measuring device calibration method according to the present invention are not limited to the above-mentioned embodiments. In addition, the design of the specific configuration of each portion of the high-frequency measuring device according to the present invention can be modified in various ways.

The invention claimed is:

1. A method for calibrating voltage values and current values detected by a high-frequency measuring device connected to a connection point between a high-frequency power supply device and a load including a plasma processing device, the high-frequency measuring device being configured to calculate an impedance as viewed from the connection point towards a load side based on the detected voltage and current values, the method comprising:
   a first step of calculating a first parameter based on impedances calculated when the high-frequency measuring device is connected to a first set of three reference loads and impedances of the first set of three reference loads;
   a second step of carrying out plasma processing by connecting the high-frequency measuring device to a load to be measured, calibrating detected voltage and current values using the first parameter, and calculating impedances as viewed from the connection point towards the load side based on the calibrated voltage and current values;
   a third step of determining three impedances that encompass, when displayed on a Smith chart, a narrower range than a range encompassed by the impedances of the first set of three reference loads, the narrower range including the impedances calculated in the second step;
   a fourth step of calculating a second parameter based on impedances calculated when the high-frequency measuring device is connected to a second set of three reference loads respectively having said three impedances and also on impedances of the second set of three reference loads; and
   a fifth step of connecting the high-frequency measuring device to the load to be measured and calibrating detected voltage and current values using the first parameter and the second parameter.

2. The calibration method according to claim 1, further comprising:
   a sixth step of calculating an impedance as viewed from the connection point towards the load side based on the voltage and current values calibrated in the fifth step;
   a seventh step of determining three impedances that encompass, when displayed on the Smith chart, a narrower range than a range encompassed by the impedances of the second set of three reference loads, said narrower range including the impedances calculated in the sixth step;
   an eighth step of calculating a third parameter based on impedances calculated when the high-frequency measuring device is connected to a third set of three reference loads respectively having the three impedances determined by the seventh step and also on impedances of the third set of three reference loads; and
   a ninth step of connecting the high-frequency measuring device to the load to be measured and calibrating detected voltage and current values using the first, second and third parameters.

3. The calibration method according to claim 2, wherein one of the reference loads among the first set of three reference loads has an impedance equal to a characteristic impedance of the high-frequency measuring device.

4. The calibration method according to claim 1, wherein one of the reference loads among the first set of three reference loads has an impedance equal to a characteristic impedance of the high-frequency measuring device.

5. A high-frequency measuring device adapted to be connected to a connection point between a high-frequency power supply device and a load including a plasma processing device, comprising:
   a voltage detector for detecting a voltage value at the connection point;
   a current detector for detecting a current value at the measurement point;
   a calibrator for calibrating the detected voltage value and the detected current value; and
   an impedance calculator for calculating an impedance as viewed from the connection point towards a load side based on the calibrated voltage value and the calibrated current value;
   wherein the calibrator is provided with:
   a first calibration unit for calibrating the detected voltage value and the detected current value using a first parameter calculated based on impedances calculated by the impedance calculator when the high-frequency measuring device is connected to a first set of three reference loads and also on impedances of the first set of three reference loads; and
   a second calibration unit for further calibrating the voltage value and the current value calibrated by the first calibration unit, using a second parameter that is calculated based on impedances calculated by the impedance calculator when the high-frequency measuring device is connected to a second set of three reference loads that encompass, when displayed on a Smith chart, a narrower range than a range encompassed by the impedances of the first set of three reference loads and also on impedances of the second set of three reference loads.

6. The high-frequency measuring device according to claim 5, wherein the calibrator is further provided with a third calibration unit for further calibrating the voltage value and the current value calibrated by the second calibration unit, using a third parameter calculated based on impedances calculated by the impedance calculator when the high-frequency measuring device is connected to a third set of three reference loads that encompass, when displayed on the Smith chart, a narrower range than a range encompassed by the impedances of the second set of three reference loads and also on impedances of the third set of three reference loads.

7. The high-frequency measuring device according claim 6, wherein one of the reference loads among the first set of three reference loads has an impedance equal to a characteristic impedance of the high-frequency measuring device.

8. The high-frequency measuring device according to claim 5, wherein the calibrator is further provided with:
   a fourth calibration unit for further calibrating the voltage and current values calibrated by the first calibration unit, using a fourth parameter calculated based on an impedance calculated by the impedance calculator when the high-frequency measuring device is connected to a fourth set of three reference loads that encompass a range narrower than a range encompassed by the impedances of the first set of three reference loads and impedances of the fourth set of three reference loads in the case of displaying on a Smith chart; and
   a judgment unit for judging whether or not the impedance calculated by the impedance calculator is, when displayed on the Smith chart, within the range encompassed by the impedances of the second set of three reference loads or within the range encompassed by the impedances of the fourth set of three reference loads;

wherein calibration is carried out by the second calibration unit when the calculated impedance is judged by the judgment unit to be within the range encompassed by the impedances of the second set of three reference loads, and calibration is carried out by the fourth calibration unit when the calculated impedance is judged by the judgment unit to be within the range encompassed by the impedances of the fourth set of three reference loads.

9. The high-frequency measuring device according claim 8, wherein one of the reference loads among the first set of three reference loads has an impedance equal to a characteristic impedance of the high-frequency measuring device.

10. The high-frequency measuring device according claim 5, wherein one of the reference loads among the first set of three reference loads has an impedance equal to a characteristic impedance of the high-frequency measuring device.

* * * * *